United States Patent [19]

Savchenko et al.

[11] 4,197,336
[45] Apr. 8, 1980

[54] METHOD FOR APPLYING PROTECTIVE COATING TO METAL PIPES

[75] Inventors: Vladimir I. Savchenko; Anatoly I. Plyshevsky; Evgeny P. Ponomarenko, all of Zaporozhie; Grigory D. Duply, Nikopol; Georgy I. Khaustov, Nikopol; Iosif J. Korobochkin, Nikopol; Olga S. Vilyams, Nikopol; Jury K. Belov, Zaporozhie, all of U.S.S.R.

[73] Assignee: Ukrainsky Nauchno-Issledovatelsky Institut Spetsialnykh Stalei, Splavov I Ferrosplavov, Zaporozhie, U.S.S.R.

[21] Appl. No.: 972,064

[22] Filed: Dec. 21, 1978

[51] Int. Cl.$^2$ .............................................. B05D 7/22
[52] U.S. Cl. .................................. 427/234; 427/237; 427/251; 118/408; 118/718; 118/730
[58] Field of Search ............... 427/234, 233, 237, 239, 427/251; 118/49, 49.1, 408

[56] References Cited

FOREIGN PATENT DOCUMENTS 260491  4/1926  United Kingdom ..................... 427/234

Primary Examiner—Sam Silverberg
Attorney, Agent, or Firm—Lackenbach, Lilling & Siegel

[57] ABSTRACT

A method comprises diffusion metal coating of pipes carried out in a vacuum chamber which contains metal evaporators. Prior to coating process a metal is fed into the interior of each pipe with the melting temperature thereof being substantially below that of the pipe metal. The metal coating of pipes is effected at a temperature above the melting temperature of the metal disposed within the pipes which are continuously rotating about their axes while axially advancing through the metal evaporator.

5 Claims, 4 Drawing Figures

METHOD FOR APPLYING PROTECTIVE COATING TO METAL PIPES

BACKGROUND OF THE INVENTION

The present invention relates to the protection of metals against corrosion, and more particularly to a method and apparatus for applying a protective coating to metal pipes.

1. Field of the Application

The invention is especially adaptable for application in the production of heat exchangers in which the pipe wall is used to partition media having different chemical-and-physical properties, for example, in heat-and-power engineering where the external medium is combustion products of high-sulphur fuel and the internal medium is water and water vapor.

The manufacture of pipes from metal which displays sufficiently high corrosion resistance in two media with different chemical-and-physical properties generally requires the use of special high-alloy steels, which are very expensive. Moreover, it is sometimes practically impossible to select the required alloy.

One way to solve the problem in question is to produce bimetallic pipes and pipes provided with a protective coating.

In the first instance, there are considerable difficulties of a technical nature involved and they render the production technique economically unprofitable.

As to the production of coated pipes, it should be observed that the protective coatings applied to pipes are often made of cheap low-alloy and low-carbon steels and, therefore, are not sufficiently corrosion-resistant when placed in two different corrosion media.

The known methods for applying protective coatings to metal pipes permit coatings of similar or substantially similar composition to be found on the inner and outer surface of the pipes.

Out of many known types of coatings applied to pipes, diffusion coatings possess the highest technological properties.

Most widely applied in industry are zinc coated pipes, then aluminum coated pipes. The pipes with diffusion coatings from refractory metals, such as chromium, manganese and silicon, are produced in an extremely limited number. The reason for this being the fact that the metal coating techniques now in use are characterized by low production efficiency, and at the same time labor-consuming and they fail to always ensure the required quality of the metal under protection. For example, the diffusion metal coating method currently widely applied consists in placing the pipes in a metallization mixture, including a powder of the metal being applied, an inert additive and a halide or ceramic powder saturated with the halogen compound of the metal being applied. The production process comprises the following stages, namely: preparing the pipes to be metallized, charging the pipes into a container, filling up the interspace between the pipes and the interior thereof with a metallization mixture (filling), sealing the container and heating it in a heat-treatment furnace and isothermal holding at a present temperature, cooling the container within the furnace, cooling the container outside the furnace, unsealing the container, and removing the particles of the metallization mixture from the surfaces of the pipes. When carrying out diffusion chromium coating of pipes from low-carbon steel for a depth of up to 0.2 mm, the isothermal hold-down time amounts to 10–15 hours, and the overall duration of the metal coating process, heating and cooling pariods included, lasts from 30 to 50 hours. With the metal being subjected to high temperatures (1000–1150°) for such a long period of time, its structure and physical properties undergo changes and are not always restorable in the course of subsequent heat treatment of the pipes. Chemical composition of the metal also tends to change (it undergoes decarbonization) in the zone adjacent to the protective diffusion layer.

The above-mentioned disadvantages restrict the application of pipes with protective coatings. This is due as a result of the impairment of the strength characteristics of the metal, such that protective coatings have found but limited application in the protection of pipes made from high-strength and refractory low-alloy steels.

The process of diffusion metal coating is commonly performed on a one-chamber heat-treatment apparatus of intermittent action. These types of apparatus are disadvantageous in that they do not lend themselves to any appreciable increase in the production output, since the increase in the unit power and in greater amount of the pipes being charged result in longer heating and cooling periods, as well as in the nonuniformity of heating of the pipes.

The technique of chromium diffusion coating of pipes is known to be performed of a three-chamber heat-treatment furnace in which the first chamber is used for heating the pipes and chromium (metallizing agent). In the second chamber the pipes being coated are saturated with chromium, and the pipes and metallizing agent are cooled in the third chamber. The chambers are arranged successively and separated from one another by means of vacuum gates. To perform the process of diffusion chromium coating, pipes are placed in an open container made in the form of a box, and are then covered with chromium or ferrochromium powder. Thereafter, the container is positioned on a movable trolley which is brought inside the first chamber. However, the production capacity of these furnaces ramains low and the metal of the pipes undergoing diffusion chromium coating is disposed to decarbonization.

Vacuum straight-through or other types of apparatus of continuous action for diffusion metal coating of pipes have been unknown to be in use. However, similar types of apparatus are used for diffusion coating of steel strip. The strip undergoes metallization in these apparatus while being passed through above a metallizing agent heated to the temperature of active evaporation. This type of apparatus comprises a chamber wherein the strip is unwound from a roll, a metallizing chamber with a metal evaporator wherein the strip is metallized, and a chamber wherein the strip is wound into a roll after the metallizing operation.

There are known two types of transporting means used to transport the pipes through heating chambers, i.e. the roller type and wheel type transporting means. Both types of said means enable the simultaneous transportation of a plurality of pipes which are capable of forward motion while concurrently rotating about their axes. Where one-sided heating of pipes is required, the wheel-type transportation mechanism is preferable in that it ensures a greater number of revolutions performed by the pipe within a given section along its travelling path. This, in turn, provides for more uniform heating of the pipe surface. The use of similar types of the pipe transporting means in vacuum metal coating apparatus fails to ensure the uniform heating and metallization of pipes. This is due to the fact that in vacuum furnaces, unlike in hearth heat-treatment furnaces, wherein heat is transferred both by heat radiation and convection of a heated gas, the heat transfer from a heating source (it being the source of vapor from the evaporating metal) is effected exclusively by way of heat radiation. Therefore, during the simultaneous transportation of a plurality of pipes disposed in a line, the pipes found in the center of the line are heated to a higher temperature than those disposed at its periphery even if equidistant from the heating source.

Due to heat losses, the heating source per se has somewhat lower temperature at the furnace peripheral sections than at its center.

SUMMARY OF THE INVENTION

It is an object of the invention to increase corrosion resistance of pipes used to partition media having different as well as corrosive properties.

Another object of the invention is to render the process of applying protective coating to a metal pipe less time-consuming.

Still another object of the invention is to reduce the production cost of pipes with protective diffusion coatings.

Yet stil another object of the invention is to expand the range of elements, that is, the metals used for the protective coatings of metal pipes.

These and other objects and features of the invention are accomplished by the provision of a method for applying a protective coating to metal pipes comprising diffusion metal coating of pipes in a vacuum chamber containing a metal being evaporated, wherein, according to the invention, prior to effecting the coating of pipes a metallizing agent is disposed into the interior of each pipe with the melting temperature thereof being substantially below the melting temperature of the pipe metal, whereas the metal coating of the pipes is carried out at a temperature above the melting temperature of the metal disposed within the pipe which is continuously rotated about its axis while being longitudinally advanced within the vacuum chamber above the evaporated metal.

The method for applying a protective coating to metal pipes permits protective diffusion coatings from various metals to be obtained on the pipe's internal and external surfaces, both of which must be corrosion-resistant to various media in which the pipes are used.

The method of the invention also makes it possible to substantially reduce the time period required for heating, metallizing and cooling of the treated pipes. This is possible to accommmplish through the direct heating of a pipe (or a plurality of pipes) in contrast to the known methods in which the pipes being coated are heated through a container and a powdered metallizing agent. In carrying out diffusion coating, the temperature of a pipe is selected in accordance with the effect it has on the metal quality, as well as on the rate of coating. Upon completion of the coating operation the cooling of the pipes is likewise effected at a high rate, since after metallization the pipes are transferred to a water-cooled admission chamber. For example, in the performing diffusion chromium coating of external surfaces of pipes, a layer of chromium 0.15 to 0.20 mm thick is formed on the pipes from low-carbon steel for a time period of 5 to 6 min as against the time period of 10 to 15 hours required to conduct metal coating of pipes according to the known method. It should be observed that the duration of the process is only limited by the timer period required for the formation of the diffusion layer on the pipes being treated.

It is to the the high speed at which a protective diffusion layer is formed that the decarbonization of the surface layers of metal adjacent to the diffusion layer is prevented.

In addition, due to high rate of applying protective coatings to pipes it is possible to enhance the production process and lower the cost of pipes provided with protective coatings.

The pipes whose internal and external surfaces are coated with protective coatings of different composition are most frequently used in various heat-exchanging installations. The selection of coatings for the external and internal surfaces of pipes is based upon the degree of corrosion resistance of these coatings in working media. An important factor to observe is that the metal applied to the internal surface of a pipe should have a melting temperature below that of the pipe metal and that it should dissolve in the pipe metal as the diffusion coating is being applied. With regard to the metal for the external surface of a pipe, its melting temperature can be variable (higher, equal or below the melting temperature of the pipe metal). The temperature at which the coating process is conducted and its duration are selected in accordance with a requisite thickness of the coating to be applied. In those cases when the temperature of the coating process has no deleterious effect on the properties of the pipe metal, the process is run at a maximum temmperature permitted in the transportation of the coated pipes. When, however, the heating temperature during metallization affects the structure and properties of the pipe metal which is not capable of being restored in the course of a subsequent heat treatment, the process temperature is selected so as to have minimum adverse effect on the properties of the pipe metal.

According to one embodiment of the invention, the melting temperature of the evaporating metal is above the melting temperature of the metal disposed in the interior of each pipe.

This makes it possible to expand the range of selection of protective coatings for use in different aggressive media, enabling the coatings of refractory metals to be applied to the external surfaces of pipes with the melting temperature thereof being above the melting temperature of the metal disposed inside the pipe and above that of the pipe metal.

According to another embodiment of the invention, the metallization of pipes is conducted at a temperature above the melting temperature of the evaporating metal.

As a result, it becomes possible to substantially raise the temperature of the diffusion coating process and thereby to step up the production process as a whole.

This, in turn, permits the production efficiency of the metallizing process to be enhanced and the cost for the coated pipes to be reduced.

According to still another embodiment of the invention, the head portion of each pipe is raised during the coating process relative to the end portion thereof so that its longitudinal axis forms with a horizontal plane an angle of not more than 15 deg in the traveling direction of the pipes.

This embodiment of the invention can be used to advantage where long-length pipes are subjected to coating.

As a result, the coating of the internal surface of a pipe is possible with the use of lumps of metal variable in shape, serving as a metallizing agent and placed preferably in the head portion of the pipe. In the process of coating, the metal disposed inside the pipe melts down under the effect of heating and gradually moves towards the end portion of the pipe to a merge therein as the latter is heated to progressively higher temperature. By alternating the angle of inclination of the pipe, it is possible to vary the time period during which the pipe remains in contact with the molten metal, as well as the parameters of the layer being applied (thickness of the layer and concentration of the element being saturated).

The objects of the invention are also accomplished by the provision of an apparatus for applying a protective coating to metal pipes, comprising a vacuum chamber accomodating metal evaporators, a pipe delivery chamber and a pipe admission chamber. In addition both chambers are provided with vacuum gates and storing devices and they are arranged on both sides of the vacuum chamber, and also included is a means intended for transporting the pipes to be coated through all said chambers and said means is formed of wheels similar in diameter and fixed in stands spaced apart from one another along the traveling path of the pipes. The axes of rotation of the wheels in each stand is parallel to one another and coincide with the axes of rotation of the similarly arranged wheels in other stands, wherein, the centers of rotation of the wheels are arranged on an imaginary arc the maximum of which is on the vertical axis of symmetry of the stand.

The apparatus of the invention for the diffusion metal pipes permits coatings of different chemical compositions to be coated simultaneously to the external and internal surfaces of the pipes being treated. The uniformity in thickness of the layer being applied is achieved due to equal temperature conditions maintained in the process of coating. This ensures arc-like arrangement of wheels in each stand and, consequently, that of the pipes found on the wheels. Since the evaporator temperature is at maximum in its central portion and somewhat lower along its periphery, the pipes which pass above the central portion of the evaporator are farther from it than other pipes.

According to one embodiment of the invention, each stand is provided with a mechanism adapted to enable its rotation about the vertical axis of symmetry of the stand.

As a result, it becomes possible to vary the relation between the speed of rotation of the pipes and that of their translatory motion, and also enables the space relationship between the pipes to be varied in accordance with their diameters thus ensuring effective coating thereof.

BRIEF DESCRIPTION OF THE DRAWINGS

The invention will be further described, by way of example only, with reference to the accompanying drawings, in which.

DESCRIPTION OF THE PREFERRED EMBODIMENTS

Figure 1:
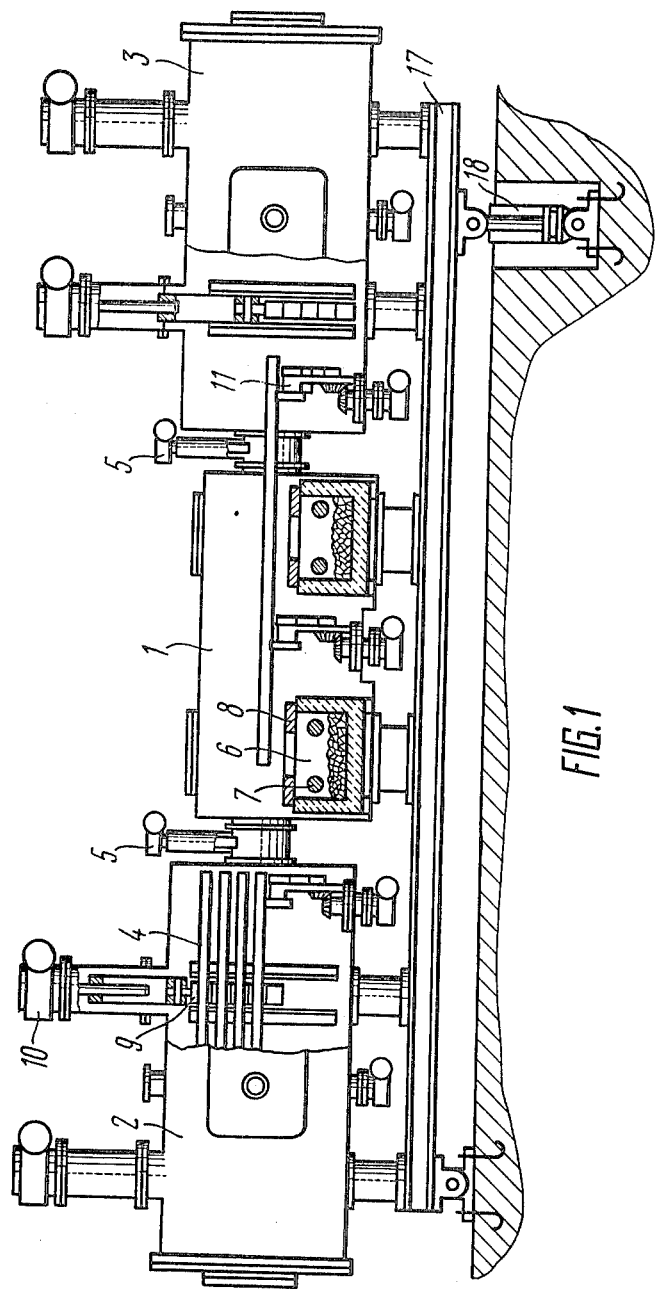
FIG. 1 is a general longitudinal or side elevational view partly in section of an apparatus for carrying into effect the method of the invention.
Figure 2:
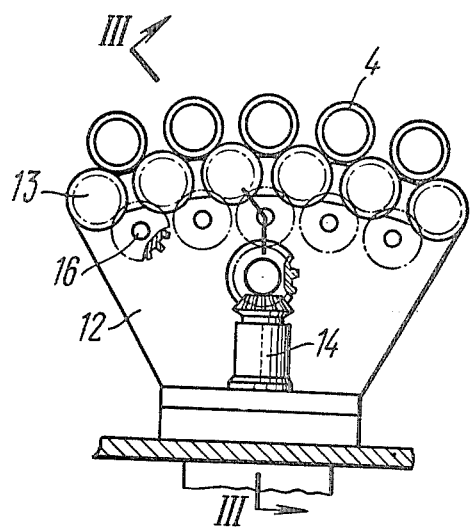
FIG. 2 is a view of a means for transporting the pipes to be coated (as viewed from the side at which the pipes are fed)
Figure 3:
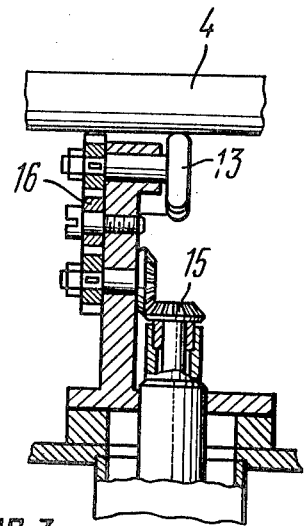
FIG. 3 is a cross-sectional view taken along the lines III—III of FIG. 2.
Figure 4:
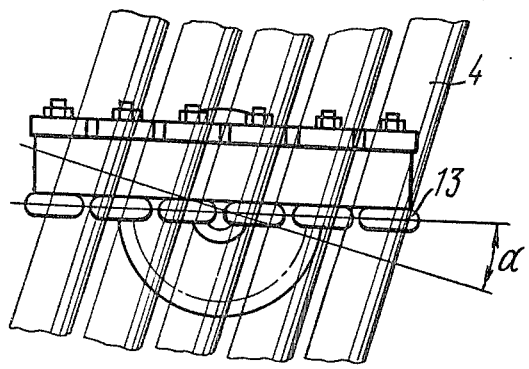
FIG. 4 is a top view of a means for transporting the pipes to be coated.

Referring now to the drawings, an apparatus for applying protective coating to metal pipes comprises chambers 1, 2, 3, such as shown in FIG. 1, intended respectively for metallizing, supplying and accomodating pipes 4. The chambers 1, 2, 3 are arranged in succession one after another and are partitioned by means of vacuum gates 5. Mounted within the metallizing chamber 1 are metal evaporators 6. The metal evaporator 6 is basically a closed vessel made from a refractory material and formed with openings for the passage of the pipes 4. Arranged inside the evaporator 6 are heating elements 7 and baffles 8. The chambers 2 and 3 intended respectively for the delivery and admission of the pipes 4 are similar in construction and incorporate grid-like devices 9 for storing the pipes 4 which are movable in the vertical direction with the aid of an actuator 10. To enable the passage of the pipes 4 through the chambers 1, 2, 3, the apparatus of the invention is provided with a transporting means 11 (see FIGS. 1-4) which is made in the form of two stands 12 spaced apart from each other along the traveling path of the pipes 4 and fitted with wheels 13 similar in diameter. The axes of rotation of the wheels 13 in each stand 12 are in parallel relationship to one another and coincide with the axes of rotation of the wheels 13 similarly disposed on the other stand 12. The centers of rotation of the wheels 13 in each stand 12 are arranged on an imaginary arc the maximum of which is on the vertical axis of symmetry of the stand. The wheels 13 are set in rotation with the aid of a drive 14 through bevel gears 15 and idle gears 16.

In order to set the apparatus of the invention in an inclined position the chambers 1, 2, 3 are mounted on a frame 17 which bears up against a mechanism 18.

The metallizing chamber 1 can be constructed so as to accomodate one or a plurality of metal evaporators 6. To vary the speed of rotation of the pipes 4, each stand 12 is provided with a means enabling its rotation about its vertical axis of symmetry.

The apparatus of the invention operates in the following manner.

The pipes 4 prepared for coating and filled with a metallizing agent are charged into the storing device 9 incorporated in the chamber 2. The last row of pipes is positioned on the wheels 13. Next, the chambers 1, 2, 3 are sealed and then evacuated by means of vacuum pipes to a residual pressure of from $10^{-1}$ to $10^{-6}$ mm Hg. The metallizing agent disposed within the evaporators 6 is heated by means of the heating elements 7 to a temperature of active evaporation. Upon heating the metallizing agent to a required temperature, the vacuum gates 5 being open, the drive 14 of the transporting means 11 is actuated. As this happens the pipes 4 positioned on the wheels 13 are rotating as they are concurrently transferred from the chamber 2 to the chamber 1. While passing through the evaporators 6, the pipes 4 are heated and the external surfaces thereof are coated with the evaporating metallizing agent. The metallizing agent disposed inside the pipe 4 is heated by the heat off the pipe 4, whereupon it melts down to spread out along the interior surface of the pipe 4. The temperature of the pipes 4 is regulated by means of the baffles 8. After passing through the metallizing chamber 1, the pipes 4 enter the chamber 3 wherein they are removed from the wheels 13 by means of the grid-like storing device 9. To enable coating of the next batch of the pipes 4, the storing device 9 incorporated in the chamber 2 is brought one step down. After all the pipes 4 have been coated, the vacuum gates 5 are closed, and then a next batch or portion of pipes 4 to be coated is fed in to the chamber 2, while the coated pipes 4 are discharged from the chamber 3.

To vary the speed of rotation of the pipes 4 while maintaining constant the speed of their forward motion, or to vary the interaxial distance between pipes 4 of variable diameter, the angle α of rotation of the stands 12 should be changed (FIG. 4) by way of rotating the stands about their vertical axis of symmetry. Where a metallizing agent for the coating process is used in the form of lumps of metal, or where it becomes necessary to regulate the thickness of the coating layer inside the pipe 4, the apparatus of the invention is tilted at an angle of up to 15 deg by means of the mechanism 18, so that the head portion of the pipe 4 is raised in relation to the end portion thereof.

The present invention is best suitable for application in various heat-exchanging equipment used in the sulphuric-acid production, with sulphuric acid being disposed inside the pipes and running water outside of them. The diffusion coating of silicon, resistant to sulphuric acid, is applied to the interior surface of the pipe, and a diffusion coating of chromium is applied to the exterior surface thereof. To obtain these types of coatings, a 45-percent alloy of silicon with iron is fed into the interior of the pipe, whereupon the pipe undergoes coating above the evaporator containing chromium therein. The coating process is conducted at a temperature of 1350° C. Within the period of five minutes there forms on the exterior surface a layer of chromium 0.15 to 0.20 mm thick, with the concentration of chromium on the surface being of the order of 40 to 47 percent, and forming on the interior surface is a diffusion layer of silicon 0.25 to 0.30 mm thick with the concentration of silicon on the surface ranging from 17 to 25 percent.

The invention also lends itself readily for application in the production of boiler tubes for heat surfaces. In this case, a diffusion chromium coating is applied to the exterior surfaces of the tubes.

The coating process is conducted at a temperature of 1250 to 1350° C. for a time period lasting from 6 to 7 minutes. During this time a layer of chromium 0.15 to 0.20 mm thick is formed on the surface. After undergoing heat treatment, the coated tubes have structure and mechanical properties similar to those possessed by uncoated tubes.

Although the present invention has been described in some detail by way of illustration and example for purposes of clarity of understanding, it will, of course, be understood that various changes and modifications may be made in the form details, and arrangements of the parts without departing from the scope of the invention as set forth in the following claims.

What is claimed is:

1. A method for applying a protective coating to the external and internal surfaces of metal pipes, comprising disposing a metallizing agent in the interior of each pipe, said agent having a melting temperature below the melting temperature of the pipe,
    longitudinally advancing each pipe through a vacuum chamber while the pipes are rotating about their axis,
    coating by metal diffusion the external surface of the pipe in the vacuum chamber using a metal evaporator,
    utilizing the heat of the pipe during the metal coating of the external surface of the pipe to melt the metallizing agent disposed in the interior of the pipe thereby simultaneously coating the internal surface of each pipe.

2. A method as claimed in claim 1, wherein the melting temperature of the metal being evaporated is above the melting temperature of the metal fed into the interior of each said pipe.

3. A method as claimed in claim 1, wherein the metal coating process is carried out at a temperature above the melting temperature of the metal being evaporated.

4. A method as claimed in claim 1, wherein in the course of the metal coating process the head portion of each said pipe is raised relative to the end portion thereof so that its longitudinal axis forms with horizontal plane an angle of not more than 15 deg in the traveling direction of said pipes.

5. A method as claimed in claim 1, wherein the speed of rotation of said pipes is variable.

* * * * *